United States Patent
Ryu et al.

(10) Patent No.: US 11,228,060 B2
(45) Date of Patent: Jan. 18, 2022

(54) DATA INPUT SCHEDULING APPARATUS

(71) Applicant: LG CHEM, LTD., Seoul (KR)

(72) Inventors: Ho-Jin Ryu, Daejeon (KR);
Jung-Hoon Lee, Daejeon (KR);
Hyun-Ki Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 418 days.

(21) Appl. No.: 16/335,621

(22) PCT Filed: Aug. 28, 2018

(86) PCT No.: PCT/KR2018/009928
§ 371 (c)(1),
(2) Date: Mar. 21, 2019

(87) PCT Pub. No.: WO2019/074204
PCT Pub. Date: Apr. 18, 2019

(65) Prior Publication Data
US 2020/0313244 A1    Oct. 1, 2020

(30) Foreign Application Priority Data

Oct. 13, 2017   (KR) .................. 10-2017-0133577

(51) Int. Cl.
*H01M 10/42*   (2006.01)
*G01R 31/36*   (2020.01)
(Continued)

(52) U.S. Cl.
CPC ........... *H01M 10/425* (2013.01); *B60R 16/02* (2013.01); *G01R 31/3646* (2019.01);
(Continued)

(58) Field of Classification Search
CPC ...... G06F 13/14; G06F 13/38; H01M 10/425; H01M 10/482; B60R 16/02
See application file for complete search history.

(56) References Cited

U.S. PATENT DOCUMENTS 9,024,584 B2 * 5/2015 Park .................... H01M 10/425
320/116
10,001,527 B2 * 6/2018 Hase .................... G01R 31/396
(Continued)

FOREIGN PATENT DOCUMENTS

JP    H6-509896 A    11/1994
JP    2004-199658 A    7/2004
(Continued)

OTHER PUBLICATIONS

Japanese Office Action dated Aug. 25, 2020 for Application No. 2019-527499.

*Primary Examiner* — Henry Tsai
*Assistant Examiner* — Christopher A Daley
(74) *Attorney, Agent, or Firm* — Birch, Stewart, Kolasch & Birch, LLP

(57) ABSTRACT

A data input scheduling apparatus that controls a vehicle battery and a relay for changing an electric connection between output terminals of the battery, and includes a detection unit for outputting an impact detection signal when an impact is applied to the vehicle and a control unit for outputting a relay-off signal to change the relay into an off state in response to the reception of the impact detection signal, the control unit outputting the relay-off signal according to a preset control cycle.

13 Claims, 4 Drawing Sheets

(51) Int. Cl.
    *B60R 16/02*     (2006.01)
    *G06F 13/38*     (2006.01)
    *H01M 10/48*     (2006.01)
    *G06F 13/14*     (2006.01)

(52) U.S. Cl.
    CPC .............. *G06F 13/14* (2013.01); *G06F 13/38* (2013.01); *H01M 10/482* (2013.01); *H01M 2010/4271* (2013.01)

(56) References Cited

U.S. PATENT DOCUMENTS

| | | | |
|---|---|---|---|
| 10,559,861 B2 * | 2/2020 | Zheng | H01M 10/488 |
| 10,886,773 B2 * | 1/2021 | Ueno | H02J 7/0013 |
| 10,991,993 B2 * | 4/2021 | Kohlberger | H01M 10/482 |
| 2003/0026235 A1 * | 2/2003 | Vayanos | H04J 13/20 |
| | | | 370/342 |
| 2010/0121511 A1 * | 5/2010 | Onnerud | B60L 58/15 |
| | | | 701/22 |
| 2010/0121587 A1 * | 5/2010 | Vian | G01R 31/367 |
| | | | 702/63 |
| 2010/0268493 A1 | 10/2010 | Tae | |
| 2012/0094154 A1 | 4/2012 | Li | |
| 2013/0235902 A1 | 9/2013 | Patel et al. | |
| 2015/0288199 A1 | 10/2015 | Bui-Van et al. | |
| 2016/0193936 A1 | 7/2016 | Brochhaus | |
| 2016/0327943 A1 | 11/2016 | Lee | |
| 2017/0184679 A1 | 6/2017 | Hwang et al. | |
| 2017/0219656 A1 * | 8/2017 | Kim | G01R 31/367 |
| 2018/0248386 A1 * | 8/2018 | Hale | H02J 7/0021 |

FOREIGN PATENT DOCUMENTS

| | | |
|---|---|---|
| JP | 2012-85522 A | 4/2012 |
| JP | 2014-535255 A | 12/2014 |
| KR | 10-2004-0017282 A | 2/2004 |
| KR | 10-2004-0092943 A | 11/2004 |
| KR | 10-1036061 B1 | 5/2011 |
| KR | 10-2014-0073948 A | 6/2014 |
| KR | 10-2014-0124817 A | 10/2014 |
| KR | 10-2015-0085795 A | 7/2015 |
| KR | 10-2016-0045280 A | 4/2016 |
| KR | 10-1720841 B1 | 3/2017 |
| KR | 10-1727742 B1 | 5/2017 |
| KR | 10-2017-0062843 A | 6/2017 |
| KR | 10-2017-0076411 A | 7/2017 |

* cited by examiner

| CHANNEL | INPUT CYCLE |
|---|---|
| 1b | 10ms |
| 2b | 100ms |
| 3b | 10ms |
| 4b | 50ms |
| 5b | – |

| CHANNEL | INPUT CYCLE IDENTIFICATION CODE | INPUT IDENTIFICATION CODE |
|---|---|---|
| 1b | 0X8000 | 0 |
| 2b | 8 | 0 |
| 3b | 0X8000 | 0 |
| 4b | 3 | 0 |
| 5b | 0X4000 | 0 |

| CHANNEL | INPUT CYCLE IDENTIFICATION CODE | INPUT IDENTIFICATION CODE |
|---|---|---|
| 1b | 0X8000 | 0 -> 1 |
| 2b | 10 | 0 |
| 3b | 0X8000 | 0 -> 1 |
| 4b | 5 | 0 |
| 5b | 0X4000 | 0 |

FIG. 6

| CHANNEL | INPUT CYCLE IDENTIFICATION CODE | INPUT IDENTIFICATION CODE |
|---|---|---|
| 1b | 0X8000 | 1 -> 0 |
| 2b | 10 | 0 |
| 3b | 0X8000 | 1 -> 0 |
| 4b | 5 | 0 |
| 5b | 0X4000 | 0 |

FIG. 7

| CHANNEL | INPUT CYCLE IDENTIFICATION CODE | INPUT IDENTIFICATION CODE |
|---|---|---|
| 1b | 0X8000 | 0 |
| 2b | 10 | 0 -> 10 |
| 3b | 0X8000 | 0 |
| 4b | 5 | 0 -> 5 |
| 5b | 0X4000 | 0 |

FIG. 8

| CHANNEL | INPUT CYCLE IDENTIFICATION CODE | INPUT IDENTIFICATION CODE |
|---|---|---|
| 1b | 0X8000 | 0 <-> 1 |
| 2b | 10 | 10 -> 9 -> ... -> 0 |
| 3b | 0X8000 | 0 <-> 1 |
| 4b | 5 | 5 -> 4 -> ... -> 0 |
| 5b | 0X4000 | 0 |

FIG. 9

| CHANNEL | INPUT CYCLE IDENTIFICATION CODE | INPUT IDENTIFICATION CODE |
|---|---|---|
| 1b | 0X8000 | 0 |
| 2b | 10 | 0 |
| 3b | 0X8000 | 0 |
| 4b | 5 | 0 |
| 5b | 0X4000 | 0 -> 1 |

FIG. 10

| CHANNEL | INPUT CYCLE IDENTIFICATION CODE | INPUT IDENTIFICATION CODE |
|---|---|---|
| 1b | 0X8000 | 0 |
| 2b | 10 | 0 |
| 3b | 0X8000 | 0 |
| 4b | 5 | 0 |
| 5b | 0X4000 | 1 -> 0 |

DATA INPUT SCHEDULING APPARATUS

TECHNICAL FIELD

The present application claims priority to Korean Patent Application No. 10-2017-0133577 filed on Oct. 13, 2017 in the Republic of Korea, the disclosures of which are incorporated herein by reference.

The present disclosure relates to a data input scheduling apparatus, and more particularly, to a data input scheduling apparatus for scheduling data input of a data input device that receives data through a plurality of channels.

BACKGROUND ART

Secondary batteries, which are easy to apply to various product groups and have good electrical energy characteristics such as high energy density, are widely used for electric vehicles (EVs) or hybrid vehicles (HVs), driven by electric driving sources, as well as portable devices.

The secondary batteries are capable of repeatedly charging and discharging by electrochemical reactions, which may reduce the use of fossil fuels drastically, and also generate no by-products due to the use of energy. For this reason, the secondary batteries are attracting attention as a new environment-friendly energy source for improving energy efficiency.

Generally, an assembly includes a plurality of unit assembly secondary cells, and a battery pack applied to a vehicle or the like includes a plurality of the assemblies or battery modules. The cell includes a positive electrode current collector, a separator, an active material, an electrolyte, an aluminum thin film layer and the like and allows charging and discharging by an electrochemical reaction among the components.

The battery pack further includes a battery management system (BMS) for monitoring and controlling a state of a secondary battery by applying an algorithm for controlling a power supplied to a driving load such as a motor, measuring electric characteristic values such as current and voltage, controlling charge/discharge, controlling equalization and estimating a state of charge (SOC).

More specifically, a data input device included in the BMS receives measurement data such as the voltage, current and temperature of the battery pack, and monitors and controls a state of the secondary battery through an algorithm for charge/discharge control, voltage equalization control, estimation of SOC or the like as described above.

For this, the data input device has a plurality of channels and receives various measurement data through each channel. For example, the voltage of the battery pack, the voltage of the fuse, and the voltage of the insulation resistor and the like are input through each channel.

At this time, in order to receive measurement data through one of the plurality of channels included in the data input device, data input time of the measurement data and channel change time required to change to the next channel are required.

That is, the time obtained by adding the data input time and the channel change time is required for the input of the measurement data for each channel, and the time proportional to the number of channels is taken to receive the measurement data through all of the plurality of channels of the data input device.

In addition, an input cycle for receiving measurement data is set to each channel. Also, if a channel receives measurement data that is demanded in real time, the input cycle is set to be short, and if a channel receives measurement data that is demanded in a relatively long cycle, the input cycle is set to be long.

At this time, if the number of channels included in the data input device is large, when measurement data is sequentially input to the plurality of channels, the minimum time for inputting the measurement data one time to all channels exceeds the input cycle of the channel whose input cycle is set to be short, thereby causing an error in the measurement data input.

DISCLOSURE

Technical Problem

The present disclosure is directed to providing a data input scheduling apparatus, which is capable of receiving data within an input cycle without exceeding the input cycle of a channel by controlling a data input device to receive data to a channel among a plurality of channels, which corresponds to the result of an identification code checking work for checking an input cycle identification code and an input identification code.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a data input scheduling apparatus of a data input device that receives data through a plurality of channels, the data input scheduling apparatus comprising: an allocation unit configured to allocate any one of a short cycle code, a long cycle code and an event code as an input cycle identification code and allocate any one of an input code and a non-input code as an input identification code to each of the plurality of channels; and a control unit configured to perform an identification code checking work for checking the input cycle identification code and the input identification code and to control the data input device to receive the data through a channel corresponding to the result of the identification code checking work among the plurality of channels.

Preferably, the allocation unit may allocate a short cycle code as the input cycle identification code of a channel whose input cycle is equal to or smaller than a total data input time of the data input device among the plurality of channels, and allocate a long cycle code as the input cycle identification code of a channel whose input cycle is greater than the total data input time of the data input device among the plurality of channels.

Preferably, the allocation unit may allocate the short cycle code as the input cycle identification code of a channel whose input cycle is equal to or smaller than a total data input time of the data input device among the plurality of channels, and allocate the long cycle code as the input cycle identification code of a channel whose input cycle is greater than the total data input time of the data input device among the plurality of channels.

Preferably, the allocation unit may calculate the total data input time using an equation below:

$$Tt = nt \times Ti + (nt-1) \times Ts \quad \text{<Equation>}$$

where Tt represents the total data input time, nt represents a number of channels of the plurality of channels, Ti represents a data input time per channel, and Ts represents a channel change time.

Preferably, the allocation unit may calculate the long cycle code by using at least one of the input cycle of a channel whose input cycle is greater than the total data input time of the data input device among the plurality of channels, a number of channels whose input cycle is equal to or smaller than the total data input time of the data input device among the plurality of channels, and a minimum data input time of the data input device.

Preferably, the allocation unit may calculate the long cycle code including the number of times of input standby of a channel whose input cycle is greater than the total data input time of the data input device among the plurality of channels.

Preferably, the allocation unit may calculate the minimum data input time using an equation below:

$$Tmin = Ti + Ts \qquad <Equation>$$

where Tmin represents the minimum data input time, Ti represents a data input time per channel, and Ts represents a channel change time.

Preferably, the allocation unit may calculate the long cycle code using an equation below:

$$Cl = Ci/(ns \times Tmin) - ns \qquad <Equation>$$

where Cl represents the long cycle code, Ci represents the input cycle of a channel whose input cycle is greater than the total data input time of the data input device among the plurality of channels, ns represents the number of channels whose input cycle is equal to or smaller than the total data input time of the data input device among the plurality of channels, and Tmin represents the minimum data input time.

Preferably, the control unit may perform the identification code checking work to each of the plurality of channels in order, and when the input cycle identification code of a channel is the short cycle code and the input identification code of the channel is the input code as a result of the identification code checking work, the control unit may change the input identification code of the channel into the non-input code and controls the data input device to receive the data through the corresponding channel.

Preferably, the control unit may control the data input device to receive the data one time through all channels whose input cycle identification code is the short cycle code, and then changes the input identification code into the input code.

Preferably, the control unit may perform the identification code checking work to each of the plurality of channels in order, and when the input cycle identification code of a channel is the long cycle code and the input identification code of the channel is the input code as a result of the identification code checking work, the control unit may change the input identification code of the channel into the long cycle code.

Preferably, whenever controlling the data input device to receive the data one time through all channels whose input cycle identification code is the short cycle code, the control unit may decrease the changed long cycle code, and when the decreased long cycle code of a channel becomes equal to the input code, the control unit may control the data input device to receive the data through the corresponding channel.

Preferably, the allocation unit may allocate the event code as the input cycle identification code of a channel that receives the data when an input request signal is received among the plurality of channels, and when the input request signal is received, the allocation unit may allocate the input code as the input identification code of the corresponding channel.

Preferably, the control unit may perform the identification code checking work to each of the plurality of channels in order, and when the input cycle identification code of a channel is the event code and the input identification code of the channel is the input code as a result of the identification code checking work, the control unit may change the input identification code of the channel into a non-input code and controls the data input device to receive the data through the corresponding channel.

In another aspect of the present disclosure, there is also provided a battery pack, which comprises the data input scheduling apparatus.

In another aspect of the present disclosure, there is also provided a vehicle, which comprises the data input scheduling apparatus.

Advantageous Effects

According to the present disclosure, since a data input device is controlled to receive data to a corresponding channel among a plurality of channels, which corresponds to the result of an identification code checking work for checking an input cycle identification code and an input identification code, it is possible to receive data within an input cycle without exceeding the input cycle of the channel, thereby preventing an error from occurring in the input data.

DESCRIPTION OF DRAWINGS

FIGS. 6 to 10 are diagrams showing other examples where the allocation unit allocates an input cycle identification code and an input identification code to each of the plurality of channels.

BEST MODE

Figures 1, 2, 3:
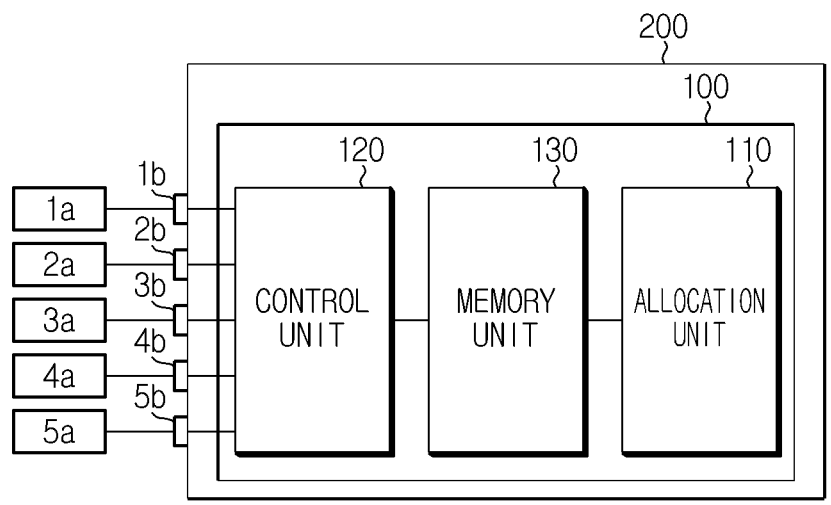
FIG. 1 is a circuit diagram schematically showing a configuration and circuit connection of a data input scheduling apparatus according to an embodiment of the present disclosure and a data input device including the data input scheduling apparatus.
FIG. 2 is a diagram showing an input cycle predetermined for each of a plurality of channels provided in the data input device.
FIG. 3 is a diagram showing an example where an allocation unit allocates an input cycle identification code and an input identification code to each of the plurality of channels.

The above objects, features and advantages will be described in detail below with reference to the accompanying drawings, so that those skilled in the art to which the present disclosure belongs can easily implement the technical idea of the present disclosure. In the explanations of the present disclosure, if it is deemed that any specific explanation of the related technology can unnecessarily obscure the gist of the present disclosure, the detailed explanation may be omitted. Hereinafter, a preferred embodiment according to the present disclosure will be described in detail with reference to the accompanying drawings. In the drawings, the same reference numerals are used to indicate the same or similar components.

FIG. 1 is a circuit diagram schematically showing a configuration and circuit connection of a data input scheduling apparatus according to an embodiment of the present disclosure and a data input device including the data input scheduling apparatus.

Referring to FIG. 1, the data input scheduling apparatus 100 according to an embodiment of the present disclosure may include an allocation unit 110, a control unit 120 and a memory unit 130. The data input scheduling apparatus 100 may be included in a data input device 200 to control an input order of data that are input to channels of the data input device 200.

Here, the data input device 200 may be a battery management system that is included in a battery pack to receive data measured from the battery pack. At this time, the data measured from the battery pack and received in the data input device 200 may be at least one of a voltage of the battery pack, a voltage of a fuse, a voltage of an output terminal of a positive electrode of the battery pack, a voltage of an insulation resistor, and a voltage of an output terminal of a negative electrode of the battery pack. In addition, the data input device 200 may include a plurality of channels 1b, . . . , 5b for receiving the input data as above.

The following description will be based on a case where five channels 1b, . . . , 5b are provided at the data input device 200. For example, a voltage of the battery pack, a voltage of a fuse, a voltage of an output terminal of a positive electrode of the battery pack, a voltage of an insulation resistor, and a voltage of an output terminal of a negative electrode of the battery pack may be input as data to the plurality of channels 1b, . . . , 5b of the data input device 200, respectively. For this, the plurality of channels 1b, . . . , 5b may be connected a plurality of data output terminals 1a, . . . , 5a that outputs a voltage of the battery pack, a voltage of a fuse, a voltage of an output terminal of a positive electrode of the battery pack, a voltage of an insulation resistor, and a voltage of an output terminal of a negative electrode of the battery pack, respectively.

The allocation unit 110 may allocate any one of a short cycle code, a long cycle code and an event code as an input cycle identification code to each of the plurality of channels 1b, . . . , 5b. In addition, the allocation unit 110 may allocate any one of an input code and a non-input code as an input identification code to each of the plurality of channels 1b, . . . , 5b.

More specifically, the allocation unit 110 may allocate any one of a short cycle code, a long cycle code and an event code to each of the plurality of channels 1b, . . . , 5b as the input cycle identification code for identifying an input cycle. In addition, the allocation unit 110 may allocate any one of an input code and a non-input code to each of the plurality of channels as the input identification code for identifying whether or not to receive data.

Here, the short cycle code may be a code for identifying a channel which should receive data at every relatively short time. For example, the short cycle code may be "0X8000". In addition, the long cycle code may be a code for identifying a channel which should receive data at every relatively long time. For example, the long cycle code may be "10" or "5". Moreover, the event code may be a code for identifying a channel which should receive data when an input request signal is received from the outside. For example, the event code may be "0X4000".

Meanwhile, the input code may be a code meaning that the control unit 120, explained later, should control the data input device 200 to receive data through the corresponding channel. For example, the input code may be "0" or "1". In addition, the non-input code may be a code meaning that the control unit 120, explained later, should control the data input device 200 not to receive data through the corresponding channel. For example, the non-input code may be "0" or "1".

When input identification codes are initially allocated to all of the plurality of channels 1b, . . . , 5b, the allocation unit 110 may allocate the input code as the input identification codes of the channels 1b, . . . , 4b whose input cycle identification codes are the short cycle code or the long cycle code among the plurality of channels 1b, . . . , 5b. In addition, when the input identification codes of the plurality of channels are initially allocated, the allocation unit 110 may allocate the non-input code as the input identification code of the channel 5b whose input cycle identification code is the event code among the plurality of channels 1b, . . . , 5b.

Meanwhile, the allocation unit 110 may set the input cycle identification code as one of a short cycle code, a long cycle code and an event code, corresponding to the input cycles of the plurality of channels 1b, . . . , 5b.

More specifically, the allocation unit 110 may allocate the short cycle code as the input cycle identification codes of the channels 1b, 3b whose input cycles are equal to or smaller than a total data input time of the data input device 200 among the plurality of channels 1b, . . . , 5b.

Here, the total data input time may be a time required for receiving data one time through all of the plurality of channels. More specifically, when data is received through the plurality of channels, if data is received through any one channel, a data input time required for inputting the data and a channel change time required for changing the channel into another channel may be taken.

From this, the allocation unit 110 may calculate the total data input time using Equation 1 below.

$$Tt = nt \times Ti + (nt-1) \times Ts \qquad \text{<Equation 1>}$$

where Tt represents the total data input time, nt represents the number of channels of the plurality of channels, Ti represents a data input time per channel, and Ts represents a channel change time.

The allocation unit 110 may allocate the short cycle as the input cycle identification codes of the channels 1b, 3b whose input cycle is equal to or smaller than the total data input time that is required for receiving data through all of the plurality of channels 1b, . . . , 5b.

Meanwhile, the allocation unit 110 may allocate the long cycle code as the input cycle identification codes of the channels 2b, 4b whose input cycles are greater than the total data input time of the data input device 200 among the plurality of channels 1b, . . . , 5b.

At this time, the allocation unit 110 may calculate the long cycle code and allocate the calculated long cycle code as the input cycle identification codes of the channels 2b, 4b whose input cycles are greater than the total data input time of the data input device 200 among the plurality of channels 1b, . . . , 5b.

More specifically, the allocation unit 110 may calculate the long cycle code by using at least one of the input cycles of the channels 2b, 4b whose input cycles are greater than the total data input time of the data input device 200 among the plurality of channels 1b, ..., 5b, the number of channels 1b, 3b whose input cycles are equal to or smaller than the total data input time of the data input device 200 among the plurality of channels 1b, ..., 5b, and a minimum data input time of the data input device 200.

Here, the minimum data input time may mean a minimum time required for receiving data through one channel.

At this time, the allocation unit 110 may calculate the minimum data input time using Equation 2 below.

$$Tmin=Ti+Ts \qquad \text{<Equation 2>}$$

where Tmin represents the minimum data input time, Ti represents a data input time per channel, and Ts represents a channel change time.

In other words, the allocation unit 110 may calculate the long cycle code including the number of times of input standby of the channels 2b, 4b whose input cycles are greater than the total data input time of the data input device 200 among the plurality of channels 1b, ..., 5b.

Here, the number of times of input standby may mean the number of times of receiving data one time through all channels whose input cycles are equal to or greater than the total data input time of the data input device 200 among the plurality of channels, without receiving data through a channel whose input cycle is greater than the total data input time of the data input device 200 among the plurality of channels.

For example, if the number of times of input standby is "5", data is not received through the channels 2b, 4b whose input cycles are greater than the total data input time of the data input device 200 among the plurality of channels 1b, ..., 5b, and the operation of receiving data one time through all channels 1b, 3b whose input cycles are equal to or greater than the total data input time of the data input device 200 among the plurality of channels 1b, ..., 5b may be repeated five times.

At this time, the allocation unit 110 may calculate the long cycle code using Equation 3 below.

$$Cl=Ci/(ns\times tmin)-ns \qquad \text{<Equation 3>}$$

where Cl represents the long cycle code, Ci represents the input cycle of a channel whose input cycle is greater than the total data input time of the data input device among the plurality of channels, ns represents the number of channels whose input cycle is equal to or smaller than a total data input time of the data input device among the plurality of channels, and Tmin represents the minimum data input time.

FIG. 2 is a diagram showing an input cycle predetermined for each of a plurality of channels provided in the data input device, and FIG. 3 is a diagram showing an example where the allocation unit allocates an input cycle identification code and an input identification code to each of the plurality of channels.

Referring to FIGS. 2 and 3 further, the process for the allocation unit 110 to allocate an input cycle identification code and an input identification code to each of the plurality of channels 1b, ..., 5b will be described as an example, based on the case where among the plurality of channels 1b, ..., 5b included in the data input device 200, the input cycles of the channel "1b", the channel "2b", the channel "3b" and the channel "4b" are respectively determined in advance as 10 ms, 100 ms, 10 ms and 50 ms, the input cycle of the channel "5b" is not determined, and the data input time per channel and the channel change time are respectively 3 ms and 2 ms.

First, the allocation unit 110 may calculate the total data input time as 23 ms using Equation 1.

As shown in FIG. 3, after that, the allocation unit 110 may allocate the short cycle code of "0X8000" as the input cycle identification codes of the channel "1b" and the channel "3b" whose input cycles are equal to or smaller than the total data input time of 23 ms.

In addition, the allocation unit 110 may calculate the long cycle code as "10" and "5" to allocate the long cycle code as the input cycle identification codes of the channel "2b" and the channel "4b" whose input cycles are greater than the total data input time of 23 ms by using Equation 3, and allocate the calculated long cycle codes of "10" and "5" as the input cycle identification codes of the channel "2b" and the channel "4b", respectively.

Moreover, the allocation unit 110 may allocate the event code of "0X4000" as the input cycle identification code of the channel "5b" whose input cycle is not determined in advance.

Meanwhile, when the input identification codes of the plurality of channels 1b, ..., 5b are initially allocated, the allocation unit 110 may allocate the input code "0" as the input identification codes of the channels 1b, ..., 4b whose input cycle identification codes are the short cycle code or the long cycle code among the plurality of channels 1b, ..., 5b. In addition, when the input identification codes of the plurality of channels 1b, ..., 5b are initially allocated, the allocation unit 110 may allocate the non-input code "0" as the input identification code of the channel 5b whose input cycle identification code is the event code among the plurality of channels 1b, ..., 5b.

At this time, for the input identification codes of the channels 1b, ..., 4b whose input cycle identification codes are the short cycle code or the long cycle code among the plurality of channels 1b, ..., 5b, "0" may be allocated as the input code, and "1" may be allocated as the non-input code. In addition, for the input identification code of the channel 5b whose input cycle identification code is the event code among the plurality of channels 1b, ..., 5b, "1" may be allocated as the input code, and "0" may be allocated as the non-input code.

Finally, the allocation unit 110 may allocate the input cycle identification code and the input identification code to each of the plurality of channels 1b, ..., 5b as shown in FIG. 3.

Hereinafter, the process for control unit 120 to control the data input device 200 to receive data through any one channel among the plurality of channels 1b, ..., 5b by using the input cycle identification code and the input identification code will be described.

Figures 4, 5:
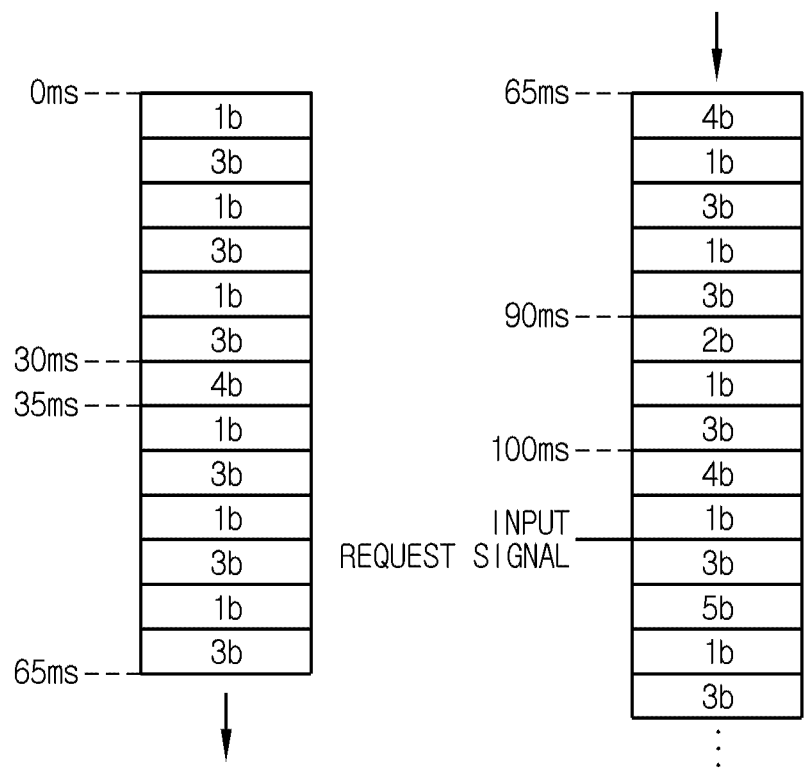
FIG. 4 is a diagram showing another example where the allocation unit allocates an input cycle identification code and an input identification code to each of the plurality of channels.
FIG. 5 is a diagram showing channels receiving data in order by controlling the data input device using a control unit.

FIG. 4 is a diagram showing another example where the allocation unit allocates an input cycle identification code and an input identification code to each of the plurality of channels, FIG. 5 is a diagram showing channels receiving data in order by controlling the data input device using a control unit, and FIGS. 6 to 10 are diagrams showing other examples where the allocation unit allocates an input cycle identification code and an input identification code to each of the plurality of channels.

Referring to FIGS. 3 to 10 further, the control unit 120 may control the data input device 200 to receive any one channel among the plurality of channels 1b, ..., 5b, corresponding to the input cycle identification code and the input identification code allocated to the plurality of channels 1b, ..., 5b by the allocation unit 110.

More specifically, the allocation unit 110 may perform an identification code checking work for checking the input cycle identification code and the input identification code, and control the data input device 200 to receive data through a channel corresponding to the result of the identification code checking work among the plurality of channels 1b, . . . , 5b.

First, the control unit 120 may perform the identification code checking work to each of the plurality of channels 1b, . . . , 5b in order. If the input cycle identification code is the short cycle code and the input identification code is the input code as a result of the identification code checking work, the control unit 120 may change the input identification code into the non-input code. After that, the control unit 120 may control the data input device 200 to receive data through the channels 1b, 3b whose input cycle identification code is the short cycle code and whose input identification code is changed from the input code to the non-input code.

In other words, as shown in FIG. 4, the control unit 120 may change the input identification code of the channels "1b", "3b" whose input cycle identification code is checked as the short cycle code "0X8000" and whose input identification code is checked as the input code "0" in the initial identification code checking work, into the non-input code "1". Subsequently, as shown in FIG. 5, the control unit 120 may control the data input device 200 to receive data through the channels "1b", "3b" whose input cycle identification code is checked as the short cycle code and whose input identification code is checked as the input code, in order.

In the above, it has been described that the control unit 120 controls the data input device 200 to receive data after changing the input identification code into the non-input code if the input cycle identification code is the short cycle code and the input identification code is the input code as a result of the identification code checking work. However, it is also possible that the control unit 120 controls the data input device 200 to firstly receive data through the channels 1b, 3b whose input cycle identification code is the short cycle code and whose input identification code is the input code, and then changes the input identification code into the non-input code.

After that, the control unit 120 may perform the identification code checking work one time and then change the input identification code, which has been changed into the non-input code, into the input code.

In other words, as shown in FIG. 6, the control unit 120 may change the input identification code into the input code "0", after controlling the data input device 200 to receive data one time through the channels "1b", "3b" whose input cycle identification code is the short cycle code "0X8000".

After that, the control unit 120 may perform the identification code checking work to each of the plurality of channels 1b, . . . , 5b in order, and then, if the identification code is the long cycle code and the input identification code is the input code as a result of the identification code checking work, the control unit 120 may change the input cycle input identification code into the long cycle code.

In other words, after controlling the data input device 200 to receive data one time through the channels 1b, 3b whose input cycle identification code is the short cycle code and whose input identification code is the input code, as shown in FIG. 7, the control unit 120 may change the input identification codes of the channels "2b", "4b" whose input cycle identification codes are the long cycle codes "10", "5" and whose input identification codes are the input code "0", into the long cycle codes "10", "5" allocated as the input cycle identification code.

After that, whenever controlling the data input device 200 to receive data one time through all channels 1b, 3b whose input cycle identification codes are the short cycle code, the control unit 120 may decrease the changed long cycle code, and if the decreased long cycle code becomes equal to the input code, the control unit 120 may control the data input device 200 to receive data through the corresponding channels 2b, 4b.

In other words, as shown in FIG. 8, whenever controlling the data input device 200 to receive data one time through all channels "1b", "3b" whose input cycle identification codes are the short cycle code, the control unit 120 may decrease the long cycle codes "10", "5" that have been changed and allocated to the input identification codes of the channels "2b" "4b".

After that, if the long cycle code that has been changed and allocated as the input identification codes of the channels "2b", "4b" is equal to the input code "0", as shown in FIG. 5, the control unit 120 may control the data input device 200 to receive data through the channels "2b", "4b".

Meanwhile, the allocation unit 110 allocates the event code as the input cycle identification code of the channel 5b that receives data when an input request signal is received among the plurality of channels 1b, . . . , 5b, and if the input request signal is received, the allocation unit 110 may allocate the input code as the input identification code of the channel 5b.

More specifically, as shown in FIG. 9, if the input request signal is received, the allocation unit 110 may allocate the input code "1" as the input identification code of the channel "5b" whose input cycle identification code is allocated as the event code "0X4000".

After that, the control unit 120 performs the identification code checking work to each of the plurality of channels 1b, . . . , 5b in order, and, if the input cycle identification code is the event code and the input identification code is the input code as a result of the identification code checking work, the control unit 120 may change the input identification code into the non-input code and control the data input device 200 to receive the data through the corresponding channel 5b.

In other words, if the input request signal is received, as shown in FIG. 10, the control unit 120 may change the input identification code of the channel "5b" whose input cycle identification code is checked as the event code "0X4000" and whose input identification code is checked as the input code "1" in the identification code checking work, into the non-input code "0". Subsequently, as shown in FIG. 5, the control unit 120 may control the data input device 200 to receive data through the channel "5b" whose input cycle identification code is checked as the event code and whose input identification code is checked as the input code.

By doing so, the control unit 120 may control the data input device 200 to receive data through a channel that is determined as having a relatively long input cycle after standing by the number of times of input standby described above, thereby preventing an error from occurring in the data input, which may be generated when receiving data through a plurality of channels in order.

The memory unit may store the input cycle identification code and the input identification code allocated to each of the plurality of channels 1b, . . . , 5b, and output or change the input cycle identification code and the input identification code corresponding to a reading or writing command of the allocation unit 110 and the control unit 120 and then store the same.

Meanwhile, a battery pack according to the present disclosure may further include at least one battery module, a case for accommodating the battery module, a cartridge, a bus bar, a battery management system for monitoring and managing electrical characteristics of the battery pack, and the like. In particular, the battery pack according to the present disclosure further includes the data input scheduling apparatus 100 provided in the battery management system to schedule the data input required for the battery management system to monitor and manage the electrical characteristics of the battery pack.

The data input scheduling apparatus 100 according to the present disclosure may be applied to a vehicle such as an electric vehicle or a hybrid vehicle. In other words, the vehicle according to the present disclosure may include the data input scheduling apparatus 100 according to the present disclosure.

The present disclosure can be substituted, modified or changed in various ways without departing from the scope of the present disclosure by those skilled in the art and thus is not limited to the above embodiments and the accompanying drawings.

What is claimed is:

1. A data input scheduling apparatus of a data input device that receives data through a plurality of channels, the data input scheduling apparatus comprising:
    an allocation unit configured to allocate any one of a short cycle code, a long cycle code and an event code as an input cycle identification code and allocate any one of an input code and a non-input code as an input identification code to each of the plurality of channels; and
    a control unit configured to perform an identification code checking work for checking the input cycle identification code and the input identification code and to control the data input device to receive the data through a channel corresponding to the result of the identification code checking work among the plurality of channels,
    wherein the allocation unit allocates the short cycle code as the input cycle identification code of a channel whose input cycle is equal to or smaller than a total data input time of the data input device among the plurality of channels, allocates the long cycle code as the input cycle identification code of a channel whose input cycle is greater than the total data input time of the data input device among the plurality of channels, and allocates the event code as the input cycle identification code of a channel whose input cycle is not determined in advance but receives the data when an input request signal is received among the plurality of channels.

2. The data input scheduling apparatus according to claim 1,
    wherein the allocation unit calculates the total data input time using an equation below:

$$Tt = nt \times Ti + (nt-1) \times Ts \qquad \text{<Equation>}$$

where Tt represents the total data input time, nt represents a number of channels of the plurality of channels, Ti represents a data input time per channel, and Ts represents a channel change time.

3. The data input scheduling apparatus according to claim 1,
    wherein the allocation unit calculates the long cycle code by using at least one of the input cycle of a channel whose input cycle is greater than the total data input time of the data input device among the plurality of channels, a number of channels whose input cycle is equal to or smaller than the total data input time of the data input device among the plurality of channels, and a minimum data input time of the data input device.

4. The data input scheduling apparatus according to claim 3,
    wherein the allocation unit calculates the long cycle code including a number of times of input standby of a channel whose input cycle is greater than the total data input time of the data input device among the plurality of channels.

5. The data input scheduling apparatus according to claim 3,
    wherein the allocation unit calculates the minimum data input time using an equation below:

$$Tmin = Ti + Ts \qquad \text{<Equation>}$$

where Tmin represents the minimum data input time, Ti represents a data input time per channel, and Ts represents a channel change time.

6. The data input scheduling apparatus according to claim 3,
    wherein the allocation unit calculates the long cycle code using an equation below:

$$Cl = Ci/(ns \times Tmin) - ns \qquad \text{<Equation>}$$

where Cl represents the long cycle code, Ci represents the input cycle of a channel whose input cycle is greater than the total data input time of the data input device among the plurality of channels, ns represents the number of channels whose input cycle is equal to or smaller than the total data input time of the data input device among the plurality of channels, and Tmin represents the minimum data input time.

7. The data input scheduling apparatus according to claim 1, wherein the total data input time is time required for receiving the data one time through all of the plurality of channels.

8. A data input scheduling apparatus of a data input device that receives data through a plurality of channels, the data input scheduling apparatus comprising:
    an allocation unit configured to allocate any one of a short cycle code, a long cycle code and an event code as an input cycle identification code and allocate any one of an input code and a non-input code as an input identification code to each of the plurality of channels; and
    a control unit configured to perform an identification code checking work for checking the input cycle identification code and the input identification code and to control the data input device to receive the data through a channel corresponding to the result of the identification code checking work among the plurality of channels,
    wherein the control unit performs the identification code checking work to each of the plurality of channels in order, and when the input cycle identification code of a channel is the short cycle code and the input identification code of the channel is the input code as a result of the identification code checking work, the control unit changes the input identification code of the channel into the non-input code and controls the data input device to receive the data through the corresponding channel.

9. The data input scheduling apparatus according to claim 8,
    wherein the control unit controls the data input device to receive the data one time through all channels whose input cycle identification code is the short cycle code, and then changes the input identification code into the input code.

10. A data input scheduling apparatus of a data input device that receives data through a plurality of channels, the data input scheduling apparatus comprising:
an allocation unit configured to allocate any one of a short cycle code, a long cycle code and an event code as an input cycle identification code and allocate any one of an input code and a non-input code as an input identification code to each of the plurality of channels; and
a control unit configured to perform an identification code checking work for checking the input cycle identification code and the input identification code and to control the data input device to receive the data through a channel corresponding to the result of the identification code checking work among the plurality of channels,
wherein the control unit performs the identification code checking work to each of the plurality of channels in order, and when the input cycle identification code of a channel is the long cycle code and the input identification code of the channel is the input code as a result of the identification code checking work, the control unit changes the input identification code of the channel into the long cycle code.

11. The data input scheduling apparatus according to claim 10,
wherein whenever controlling the data input device to receive the data one time through all channels whose input cycle identification code is the short cycle code, the control unit decreases the changed long cycle code, and when the decreased long cycle code of a channel becomes equal to the input code, the control unit controls the data input device to receive the data through the corresponding channel.

12. A data input scheduling apparatus of a data input device that receives data through a plurality of channels, the data input scheduling apparatus comprising:
an allocation unit configured to allocate any one of a short cycle code, a long cycle code and an event code as an input cycle identification code and allocate any one of an input code and a non-input code as an input identification code to each of the plurality of channels; and
a control unit configured to perform an identification code checking work for checking the input cycle identification code and the input identification code and to control the data input device to receive the data through a channel corresponding to the result of the identification code checking work among the plurality of channels,
wherein the allocation unit allocates the event code as the input cycle identification code of a channel that receives the data when an input request signal is received among the plurality of channels, and when the input request signal is received, the allocation unit allocates the input code as the input identification code of the corresponding channel.

13. The data input scheduling apparatus according to claim 12,
wherein the control unit performs the identification code checking work to each of the plurality of channels in order, and when the input cycle identification code of a channel is the event code and the input identification code of the channel is the input code as a result of the identification code checking work, the control unit changes the input identification code of the channel into a non-input code and controls the data input device to receive the data through the corresponding channel.

* * * * *